(12) United States Patent
Khoury

(10) Patent No.: US 6,608,498 B2
(45) Date of Patent: Aug. 19, 2003

(54) METHOD FOR CHARACTERIZING AN ACTIVE TRACK AND LATCH SENSE-AMP (COMPARATOR) IN A ONE TIME PROGRAMMABLE (OTP) SALICIDED POLY FUSE ARRAY

(75) Inventor: Elie Georges Khoury, Gilbert, AZ (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 107 days.

(21) Appl. No.: 09/884,148

(22) Filed: Jun. 20, 2001

(65) Prior Publication Data

US 2003/0011379 A1 Jan. 16, 2003

(51) Int. Cl.[7] .............................................. G01R 31/26
(52) U.S. Cl. ...................................................... 324/765
(58) Field of Search ........................ 365/185.2, 185.21, 365/201, 207; 714/718, 719, 721; 324/765

(56) References Cited

U.S. PATENT DOCUMENTS

| | | | | |
|---|---|---|---|---|
| 4,601,031 A | * | 7/1986 | Walker et al. | 371/10 |
| 5,623,440 A | * | 4/1997 | Saito | 365/149 |
| 6,067,263 A | | 5/2000 | Brady | 365/201 |
| 6,356,496 B1 | * | 3/2002 | Carroll et al. | 365/225.7 |

* cited by examiner

Primary Examiner—Safet Metjahic
Assistant Examiner—Etienne P LeRoux
(74) Attorney, Agent, or Firm—Peter Zawilski

(57) ABSTRACT

A non intrusive isolation testing method for each of the positive and negative input (in+ & in-) to each comparator in the array is provided. Isolation does not affect the read capability of the comparator and therefore characterization of the comparator is accomplished by using the normal read circuits of the one time programmable (OTP) array. The isolation method relies on gating the control signals by using test signals; as a result inputs to a comparator are not affected electrically. Each input has four possible control signals and therefore needs four gating test signal drivers and so a total of 16 input combinations are available to each comparator.

22 Claims, 4 Drawing Sheets

METHOD FOR CHARACTERIZING AN ACTIVE TRACK AND LATCH SENSE-AMP (COMPARATOR) IN A ONE TIME PROGRAMMABLE (OTP) SALICIDED POLY FUSE ARRAY

FIELD OF THE INVENTION

The field of the invention relates to a method and apparatus for characterizing comparators and more specifically to a method and apparatus for characterizing an active track & latch sense-amp, comparator, in a one-time programmable (OTP) salicided poly fuse array.

BACKGROUND OF THE INVENTION

An OTP (one time programmable) ROM is an array of memory cells having fuse or anti-fuse fusible links wherein fuse links are opened by blowing the fuse by applying a writing current. Once a fuse link is blown the impedance of the link is much higher than that of an unblown fuse. Track and latch sense amplifiers or comparators are coupled to the outputs of the OTP fuses. These comparators are used to compare two voltages within the poly fuse array. Testing of these comparators is important in that characterization of the properties of the comparator and prior art methods of characterizing a sense-amp require a dedicated test chip designed solely or partially for the purpose of testing sense-amp, which unfortunately adds complexity to the circuit.

These comparators are designed to compare two voltages. The voltages are in the order of a few millivolts above ground level and as a result can be affected by noise during a read procedure. Therefore, a test chip used for testing a sense-amp sometimes produces inadequate results because of the errors caused by the noise.

A method of testing the track and latch comparators within the circuit would be to build a stand alone comparator with its test circuit in order to characterize its performance, unfortunately this would take the comparator out of its context of utilization resulting in an improperly characterized device and potentially incorrect results.

The comparator requires a set of pulses that are generated by a state machine in order to operate successfully. All reference inputs (in−) to the comparator are tied to single node while all the positive inputs (in+) are independent from each other. This makes characterization of the track & latch comparator difficult in that each of the input to the track & latch comparator are electrically unbalanced. As a result unbalanced testing of the comparator within the circuit is required for proper device understanding.

It would therefore be advantageous to be able to characterize an active sense-amp comparator within a memory itself without affecting the performance of the sense-amp comparator.

SUMMARY OF THE INVENTION

In accordance with the invention there is provided an integrated circuit comprising:
 a comparator including: a comparison circuit, a first input port, a second input port, and an output port; and,
 a switch integral to the integrated circuit and in electrical communication with the first input port for switchably selecting between a plurality of input signals wherein one input signal is in accordance with the circuit operation requirements and another input signal is solely for use in testing of the comparator.

In accordance with another aspect of the invention there is provided a non-intrusive method of characterizing a comparator within an integrated circuit comprising the steps of:
 providing power to the comparator;
 providing switches within the integrated circuit for controlling various test input signals to the comparator;
 switching a first control signal to the first input port of the comparator and monitoring an output signal provided at the output port;
 switching a second control signal to the second input of the comparator and monitoring an output signal provided at the output port.

BRIEF DESCRIPTION OF THE DRAWINGS

The invention will now be described with reference to the attached drawings in which.

DETAILED DESCRIPTION OF THE INVENTION

Figure 1:
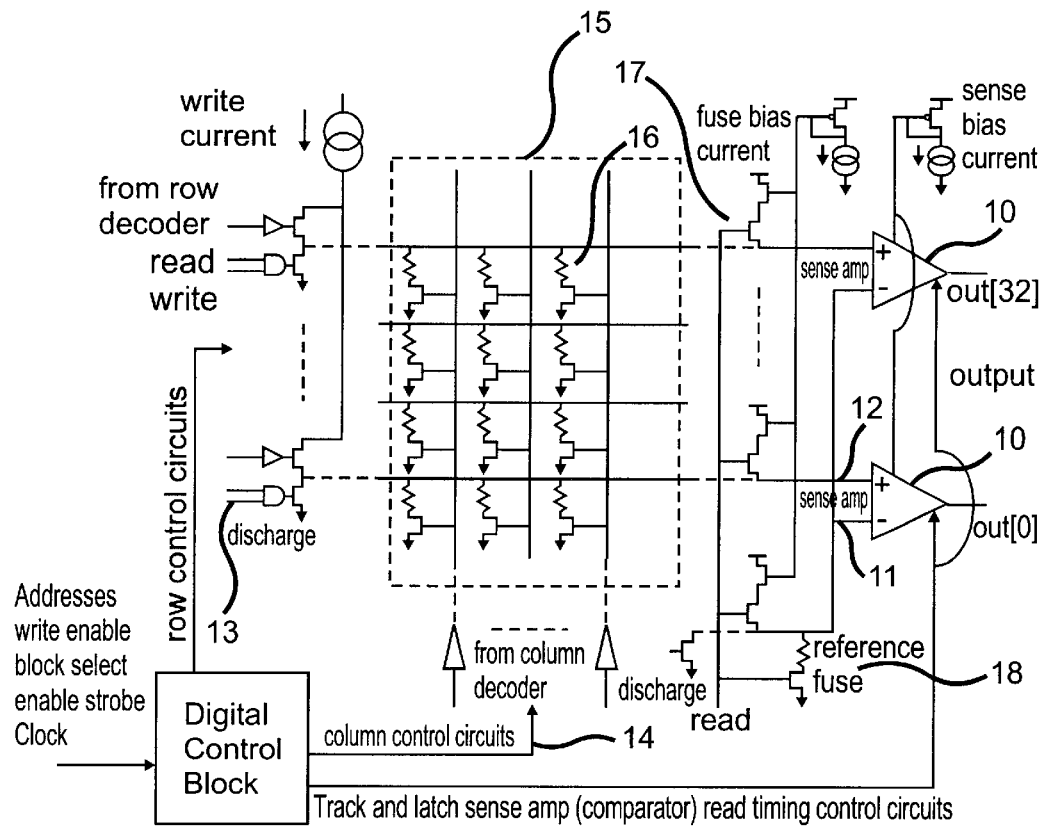
FIG. 1 is of a prior art comparator circuit as part of the poly fuse array.

FIG. 1 illustrates a one time programmable (OTP) Salicided Poly Fuse ROM 15 having a plurality of fuse elements and N-MOS transistors 16 arranged in an array. A track & latch comparator 10 is provided to the row output ports, where each track & latch comparator 10 has a negative input port 11 and a positive input port 12. The negative input port 11 (in−) from each comparator 10 is connected to a same reference node 11, while the positive input ports 12 (in+) are connected each to a different node, or row 12.

Input signal sources to the comparators 10 are controlled by 3 different signals, a row discharge signal 13 discharges the row when not in use, a column driver 14 selects the column address, selecting all cells in the column, and a read signal 17 allows a small (100 µA) current to flow into a fuse element 16, and reference fuse 18, during read a procedure.

Unfortunately in this implementation it is not possible to observe or control any active comparator within the circuit.

Figure 2:
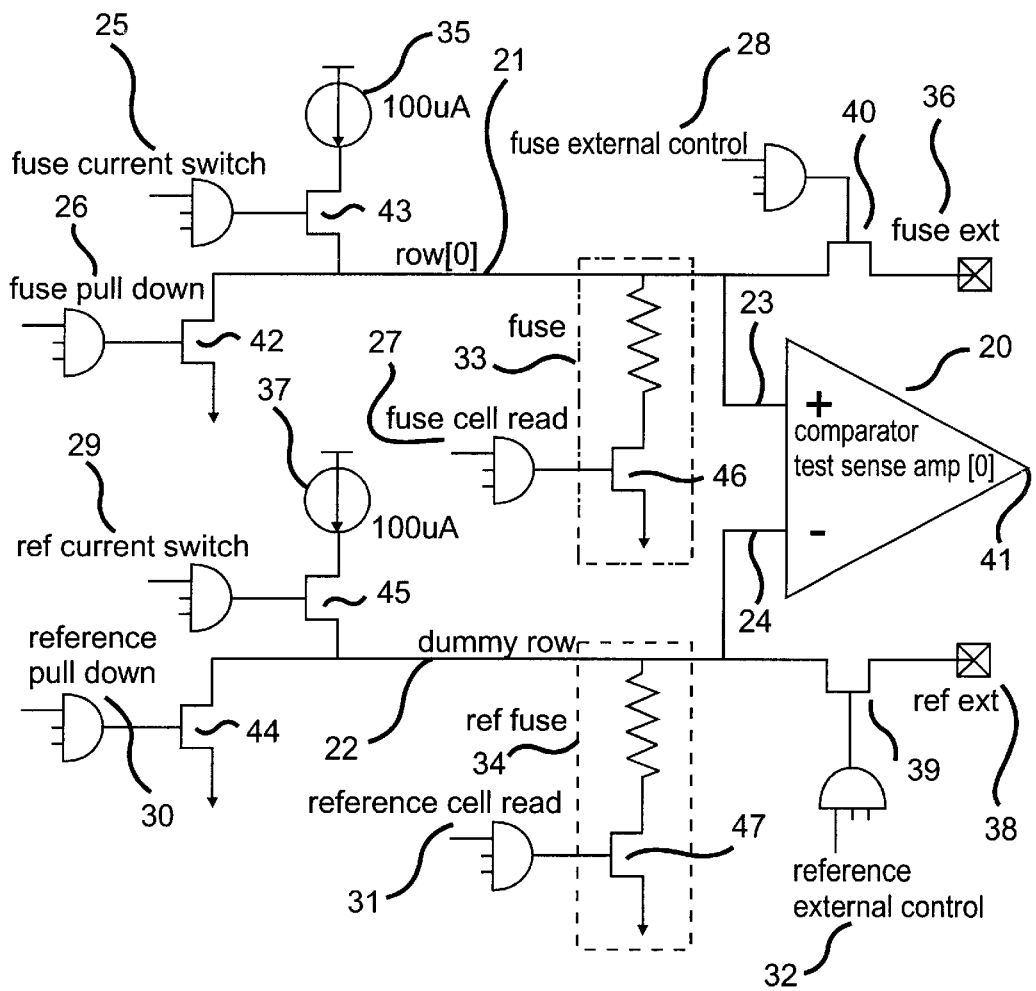
FIG. 2 is of a comparator circuit having a provision for a non intrusive method of controlling and observing the comparators.

FIG. 2 illustrates a representation of a one comparator 20 non-intrusive method of controlling and observing the comparator 20. The comparator has a negative input port 24 and a positive input port 23. The selected comparator 20 is the ROW[O] comparator, and input signals provided to the comparator 20 correspond to row[O] 21 in the test column for the positive input (in+) to the positive input port 23, and to the reference fuse in the dummy row 22 for the negative input (in−) to the negative input port 24 of the comparator 20. A fuse element 33 is coupled to the positive input port of the comparator and a reference fuse element 34 is coupled to the negative input port of the comparator. The circuit shown in FIG. 2 has two modes of operation; a first mode of operation being a test mode and the second mode of operation being a normal mode.

External access to the input nodes of the comparator are provided via two small N-MOS switches, 39 40. The first of these N_MOS switches 40 controllably ties a first external analog pin 36 to the positive input port of the comparator 20. The second of these N_MOS switches 39 controllably ties a second external analog pin 38 to the negative input port of the comparator 20. These N-MOS switches are small devices and do not load or affect the input port of the comparator.

Eight input signals are provided to the comparator 20 through additional circuitry, comprising: a Fuse-Current-Switch (FCS) signal 25, a Fuse-pull-down (FPD) signal 26, Fuse-cell-read signal (FCR) signal 27, Fuse-external-control (FEC) signal 28, Reference-Current-Switch signal (RCS) 29, Reference-pull-down (RPD) signal 30, Reference-cell-read (RCR) signal 31, Reference-external-control (REC) signal 32. The signals 25-32 are binary signals, wherein a "1" is indicative of the signal being in an "ON", or enabled, state, and a "0" indicative of he signal being in an "OFF", or disabled, state.

The Fuse-Current-Switch (FCS) signal 25 is used to control the Read signal for the fuse 33. Upon enabling the FCS 25 a current of 100 μA flows into fuse 33 from the current source 35. In test mode of operation, when FCS 25 is disabled, the 100 μA from the current source 35 is unable to flow into the fuse 33. Normally FCS 25 is set in the enabled state, or FCS=1.

The Fuse-pull-down (FPD) 26 signal is used to control the row discharge. When the FPD signal 26 is disabled the fuse node is left charged. In the normal mode of operation the FCS signal 25 is enabled, or FCS=1.

The Fuse-cell-read signal (FCR) 27 signal gates the column address signal for the fuse 33. When FCR is disabled no read (100 μA) current flows into the fuse 33 from the current source 35. In the normal mode of operation the FCR signal is enabled, or FCR=1.

The Fuse-external-control (FEC) 28 signal controls a switch that connects the positive input port 23, in+, of the comparator 20 to the external node fuse_ext 36. In normal mode of operation the FEC 28 signal is disabled, or FEC=0.

The Reference-Current-Switch (RCS) 29 gates the Read signal, thereby allowing a current of 100 μA to flow into the reference fuse 34 from the current source 37. In the test mode of operation the RCS 29 signal is disabled and therefore the 100 μA read current is not allowed to flow into the reference fuse 34. In the normal mode of operation RCS 29 is enabled, or RCS=1.

The Reference-pull-down (RPD) 30 signal gates the row discharge for the reference fuse 34. When the RPD 30 is disabled the reference fuse node of the dummy row 22 is left charged. In normal mode of operation the RPD 30 is enabled, or RPD=1.

The Reference-cell-read (RCR) 31 signal gates the read signal to the reference fuse 34. When RCR 31 is disabled no 100 μA read current flows into the reference fuse 34. In the normal mode of operation the RCR 31 signal is enabled, or RCR=1.

The Reference-external-control (REC) 32 signal control a switch that connects the negative input port 24, in−, of the comparator 20 to the external node ref_ext 38. In the normal mode of operation the setting for the REC is disabled, or REC=0.

In the normal mode of operation the following inputs to the positive input port of the comparator are enabled FCS, FPD, FCR, and FEC is disabled. The following inputs to the negative input port of the comparator are enabled RCS, RPD, RCR, and REC is disabled.

Each comparator 20 has two input ports, 23 and 24. There are four binary control signals available per input port. Having two sets of 4 binary control input signals allows for a possible 256 different ways of controlling the comparator. The following examples will outline examples of control that are pertinent to the invention. To those skilled in the art of circuit design it should be obvious the many different possibilities of testing this circuit are evident and should not be limited to the scope of the examples.

Figure 3:
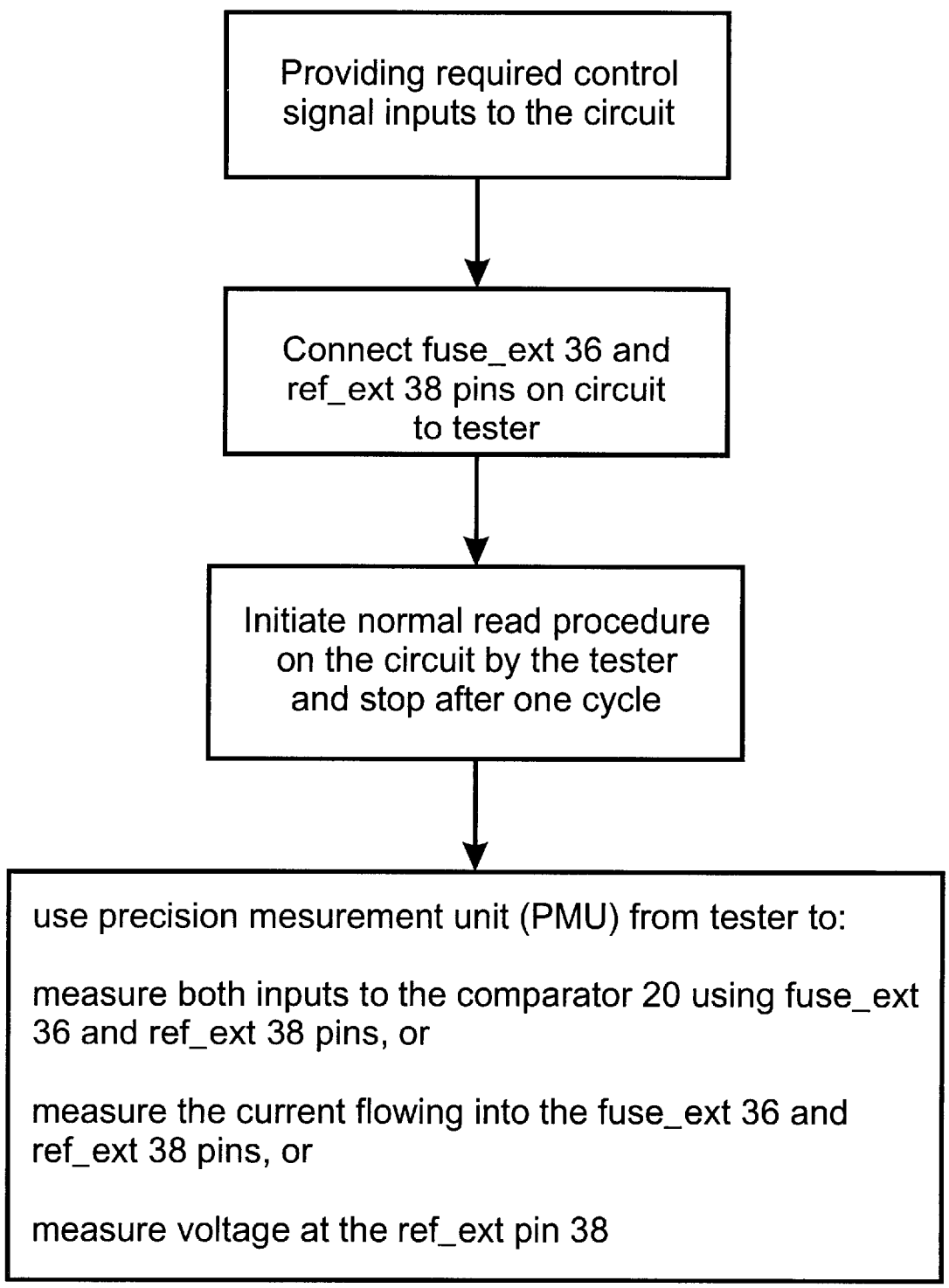
FIG. 3 outlines a method for characterizing a comparator within the poly fuse array via external contact pads.

FIG. 3 illustrates methods for performing verification on the fuse 33 and reference 34 fuse status and comparator 20 sensitivity, and verifying read current value, and verifying reference fuse 34 selection, and will aid in understanding the following examples.

EXAMPLE 1

In the first example the input voltages at the positive 23 and negative 24 input ports to the comparator 20 are verified. This verification yields information on the fuse 33 and reference 34 fuse status and comparator 20 sensitivity. Prior to initiating the method of verifying comparator input signals the following control signal inputs are provided to the circuit:

| FCS | FPD | FCR | FEC | RCS | RPD | RCR | REC |
|---|---|---|---|---|---|---|---|
| 1 | 1 | 1 | 1 | 1 | 1 | 1 | 1 |

A normal read procedure is then initiated on the circuit by a tester and stopped after the $1^{st}$ cycle of the read procedure. Using a precision measurement unit (PMU) both input signals 23 24 to the comparator 20 are measured by using the fuse_ext 36 and ref_ext 38 pins.

EXAMPLE 2

In the second example the read current value is verified. Read current that flows in the fuse or reference fuse is externally observable by using the fuse_ext 36 and ref_ext 38 pins. For this operation the fuse and/or reference fuse is not selected during the read, and the fuse_ext 36 and/or ref_ext 38 are enabled for measurement of the read current value. Prior to initiating the method of verifying the read current value the following control input signals are provided to the circuit:

| FCS | FPD | FCR | FEC | RCS | RPD | RCR | REC |
|---|---|---|---|---|---|---|---|
| 1 | 1 | 0 | 1 | 1 | 1 | 0 | 1 |

A normal read procedure is then initiated on the circuit by a tester and stopped after the $1^{st}$ cycle of the read procedure. The tester is used to sink current from the fuse_ext 36 and/or ref_ext 38 pin. The PMU of the tester measures current flowing from the fuse_ext 36 and ref_ext 38 pins. In this manner the difference between the ideal read current of 100 μA and the actual read current is noted, as well as the read current difference between the fuse 33 and reference fuse 34, and the read current variation between different circuit chips.

EXAMPLE 3

In the third example the reference fuse 34 selection is verified. The reference fuse 34 has four different settings: 4x, 6x, 8x, 10x, wherein 1x is the resistivity of the fuse 34.

Voltage on the fuse 34 is checked for each of the four reference settings. This test is useful in for observing voltage linearity developed across the reference fuse 34. Prior to initiating the method of verifying reference fuse selection the following control input signals are provided to the circuit:

| FCS | FPD | FCR | FEC | RCS | RPD | RCR | REC |
|-----|-----|-----|-----|-----|-----|-----|-----|
| 1 | 1 | 1 | 0 | 1 | 1 | 1 | 1 |

A normal read procedure is then initiated on the circuit by a tester and stopped after the $1^{st}$ cycle of the read procedure. The PMU of the tester is used to measure the voltage at the ref_ext pin 38. A different reference is then selected and the procedure is repeated for all reference fuses.

Figure 4:
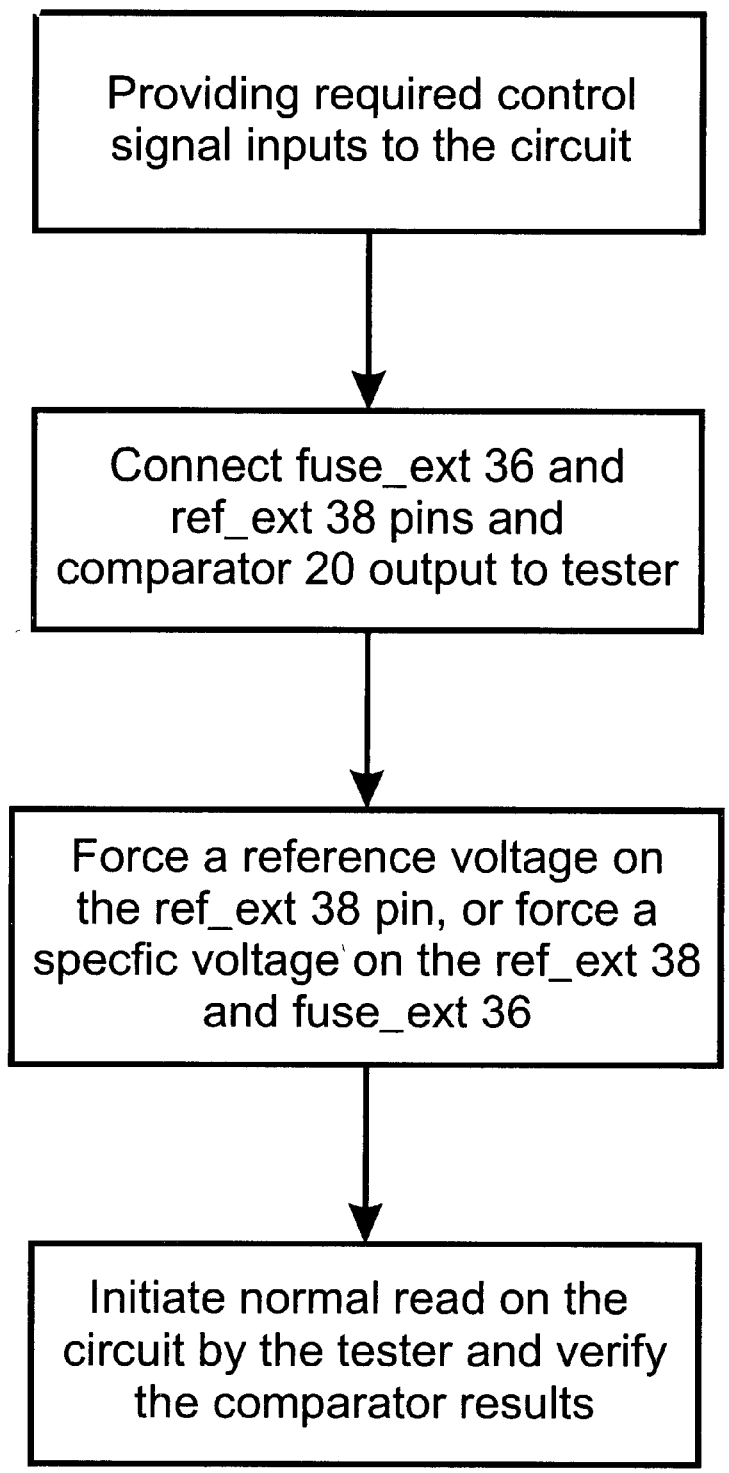
FIG. 4 outlines a method for characterizing a comparator within the poly fuse array via the comparator output.

FIG. 4 illustrates methods for evaluating the comparator 20 output signal, and verifying comparator performance over the input common mode range (CMR) and aids in understanding the following examples.

EXAMPLE 4

In the fourth example an external reference voltage is applied to the circuit via the ref_ext 38 pin. Setting an external reference voltage on this pin allows for evaluating the comparator 20 output signal. During the design phase a reference voltage other than that provided by the reference fuse is required while checking performance of the comparator array. Prior to initiating the method of verifying comparator output signal the following control input signals are provided to the circuit:

| FCS | FPD | FCR | FEC | RCS | RPD | RCR | REC |
|-----|-----|-----|-----|-----|-----|-----|-----|
| 1 | 1 | 1 | O | O | 0 | 0 | 1 |

The tester is utilized to force a reference voltage at the ref_ext 38 pin. A normal read procedure is performed on the tester and the output signal of the comparator 20 or all of the comparators is verified. The procedure is repeated with different reference voltages and different addresses, addressing different comparators within the circuit.

EXAMPLE 5

In the fifth example the comparator performance is verified over the input common mode range (CMR). This is a new design feature in that it allows for characterization of the active comparator. This verification procedure measures how the active comparator performs under varying differential input voltages, a wide CMR, and power supply and bias schemes. Prior to initiating the method of verifying comparator performance the following control input signals are provided to the circuit:

| FCS | FPD | FCR | FEC | RCS | RPD | RCR | REC |
|-----|-----|-----|-----|-----|-----|-----|-----|
| 0 | 0 | 0 | 1 | 0 | O | O | 1 |

The tester is used to force a specific voltage on the ref_38 ext and fuse_ext 36 pins and a normal read procedure is initiated. The active comparator 20 output signal is measured during this normal read procedure on the tester. The procedure is repeated using different input voltages over different CMR and power supply.

Advantageously the method of characterization of the track & latch comparator, relies solely on using a non intrusive isolation testing method for each of the positive and negative input signals (in+& in−) to one active comparator 20 in the array. Since the isolation does not affect the read capability of the comparator, the characterization of the comparator is accomplished by using the normal read circuits of the one time programmable (OTP) array. The isolation method relies on gating the control signals by using test signals; as a result inputs to a comparator are not affected electrically. Each input signal has three possible control signals and therefore needs three gating test signal.

Numerous other embodiments may be envisioned without departing from the spirit or scope of the invention.

What is claimed is:

1. An integrated circuit comprising:
  a comparator including: a comparison circuit, a first input port, a second input port, and an output port;
  a first external port for use in characterizing of the comparator; and,
  a first switch integral to the integrated circuit and in electrical communication with the first input port for switchably selecting between a first plurality of input signals wherein at least one input signal from the first plurality of input signals is in accordance with the circuit operation requirements and another input signal from the first plurality of input signals switchably selected using the first external port is solely for use in characterizing of the comparator.

2. An integrated circuit as defined in claim 1, further comprising:
  a second external port for use in characterizing of the comparator; and,
  a second switch integral to the integrated circuit and in electrical communication with the second input port for switchably selecting between a second plurality of input signals wherein at least one input signal from the second plurality of input signals is in accordance with the circuit operation requirements and another input signal from the second plurality of input signals. switchably selected using the second external port is solely for use in characterizing of the comparator.

3. An integrated circuit as defined in claim 2, comprising a first plurality of switches in electrical communication with the first input port of the comparator, and a second plurality of switches in electrical communication with the second input port of the comparator, wherein the first plurality of switches and the second plurality of switches include the first switch and the second switch, respectively.

4. An integrated circuit as defined in claim 3, comprising a poly fuse element in electrical communication with at least one of the first input port and the second input port and in electrical communication with at least one of the first plurality of switches and the second plurality of switches.

5. An integrated circuit as defined in claim 4, wherein each switch from the first plurality of switches and the second plurality of switches is for switchably coupling a ground potential, a current source, and one of the first external port and the second external port to an input port of the comparator to which the switch is coupled.

6. An integrated circuit as defined in claim 5, comprising gating circuitry for controlling the switching of the first plurality of switches and the second plurality of switches.

7. An integrated circuit as defined in claim 4, wherein the poly fuse element forms a portion of a poly fuse ROM.

8. An integrated circuit as defined in claim 7, wherein the comparator is for reading values from the poly fuse ROM; and, wherein at least one input signal is electrically coupled to at least a poly fuse ROM element.

9. An integrated circuit as defined in claim 4 wherein the poly fuse ROM comprises:

a reference poly fuse element, wherein the reference poly fuse element is coupled to the second input port and the poly fuse element is coupled to the first input port.

10. An integrated circuit as defined in claim 1, comprising a first plurality of switches and a second plurality of switches, the first plurality of switches including the first switch and the second plurality of switches including the second switch; and, a second external port, wherein at least one of the first and second plurality of switches are for switchably coupling an external port, a known voltage, and a conductor for normal operation of the integrated circuit device to a respective input port of the comparator, wherein the integrated circuit supports two modes of operation, a first mode wherein the switches are switchably operable and a second other mode wherein the switches are fixed for normal operation of the integrated circuit.

11. A non-intrusive method of characterizing a comparator circuit having a first input port and a second input port and an output port within an integrated circuit memory comprising the steps of:

providing power to the comparator circuit;

providing at least an external port;

providing a plurality of switches within the integrated circuit in electrical communication with the input ports of the comparator circuit for switchably selecting between at least one of a plurality of input signals to the comparator and the at least an external port;

switching at least a first input signal to the first input port of the comparator;

switching at least a second input signal to the second input port of the comparator;

verifying at least one of the at least a first input signal and the at least a second input signal; and, monitoring at least one of an output signal provided at the output port in response to at least one of the at least a first signal and the at least a second signal and the at least one of the at least a first signal and the at least a second signal using the at least an external port.

12. A non-intrusive method as defined in claim 11, wherein at least one of the first signal and the second signal is provided to the integrated circuit from a source external thereto using the at least an external port.

13. A non-intrusive method as defined in claim 12, wherein provision of one of the first input signal and the second input signal is performed in isolation to the other one of the first input signal and the second input signal.

14. A non-intrusive method as defined in claim 13, wherein the integrated circuit is a ROM circuit and where a signal retrieved from a memory cell within the integrated circuit is isolated from at least a control signal used for switching of the at least one of the at least a first signal and the at least a second signal.

15. A non-intrusive method as defined in claim 14, wherein the non-intrusive method is utilized for testing at least one input port of each comparator within the ROM circuit.

16. A non-intrusive method as defined in claim 15, wherein the non-intrusive method does not substantially affect input voltage levels of input signals provided to the input ports of the comparator.

17. A non-intrusive method as defined in claim 16, wherein the non-intrusive method relies on gating the input signals by using control signals; and where input signals provided to the comparator are other than substantially affected electrically by gating of the input signals.

18. A non-intrusive method as defined in claim 11, wherein verification of the input voltages to the first input port and to the second input port is performed by controllably switching at least an internal source for providing at least one of the at least a first test input signal and the at least a second test input signal to the first and second input ports.

19. A non-intrusive method of as defined in claim 11, wherein the step of verification is performed by controllably switching the first external port to the first input port and the second external port to the second input port of the comparator circuit and the step of monitoring is performed by measuring the current flowing through these external ports.

20. A non-intrusive method of as defined in claim 11, wherein verification of a reference fuse selection is performed by controllably switching the at least an external port to the second input port of the comparator and by measuring the voltage at this port.

21. A non-intrusive method as defined in claim 11, wherein an evaluation of the comparator output signal is performed by controllably switching the at least an external port to the second input port and by applying a reference voltage to the at least an external port while measuring the output signal of the comparator.

22. A non-intrusive method defined in claim 11, wherein verification over the input common mode range of the comparator is performed by controllably switching an external port from the at least an external port to the first input port and an external port from the at least an external port to the second input port of the comparator and by applying a specific voltage to each of the external ports while measuring the output signal on the comparator output port.

* * * * *